United States Patent

[11] 3,619,478

[72] Inventor Bruno Staiger
Erligheim, Germany
[21] Appl. No. 20,588
[22] Filed Mar. 18, 1970
[45] Patented Nov. 9, 1971
[73] Assignee International Standard Electric Corporation
New York, N.Y.
[32] Priority Mar. 27, 1969
[33] Germany
[31] P 19 15 780.3

[54] ELECTRICAL CONNECTING ELEMENT
1 Claim, 11 Drawing Figs.

[52] U.S. Cl. .......... 174/68.5, 29/626, 85/36, 264/230, 264/249, 317/101 CC, 339/17 C
[51] Int. Cl. .......... H05k 1/18
[50] Field of Search .......... 174/68.5, 88 R; 339/17 R, 17 C, 18 R, 18 B; 29/626; 85/36; 151/7; 264/230, 249

[56] References Cited

UNITED STATES PATENTS

| | | | |
|---|---|---|---|
| 2,965,812 | 12/1960 | Bedford, Jr. | 174/68.5 X |
| 3,022,480 | 2/1962 | Tiffany | 339/18 R |
| 3,121,771 | 2/1964 | Stearns | 174/68.5 |
| 3,275,736 | 9/1966 | Hotine et al. | 174/68.5 X |

OTHER REFERENCES

Uberbacher, " Heat-Shrunk Plastic Attachments," published in IBM Technical Disclosure Bulletin, Vol. 9, No. 3, Aug. 1966, pp. 311–312, Copy in 151–157.

*Primary Examiner*—Darrell L. Clay
*Attorneys*—C. Cornell Remsen, Jr., Walter J. Baum, Paul W. Hemminger, Charles L. Johnson, Jr. and Thomas E. Kristofferson

ABSTRACT: The electrical connecting element consists of a flanged sleeve which is pushed over the terminal pins, establishing the electrical contact between a terminal pin and a printed circuit. The element is applied in a form- and force-locking manner, and is protected against external influences, such as dust and vibration, by means of a shrink-on ring.

INVENTOR
BRUNO STAIGER

BY Harvey S. Hertz
ATTORNEY

INVENTOR

BRUNO STAIGER

BY Harvey S. Hertz

ATTORNEY

INVENTOR
BRUNO STAIGER

BY Harvey S. Hertz
ATTORNEY

INVENTOR
BRUNO STAIGER

BY Howard L. Hertz
ATTORNEY

INVENTOR
BRUNO STAIGER

BY Harvey S. Hertz
ATTORNEY

INVENTOR

BRUNO STAIGER

BY

Harry S. Hertz

ATTORNEY

ELECTRICAL CONNECTING ELEMENT

The present invention relates in general to an electrical connecting element and, more particularly, to a flanged sleeve which establishes contact between a stationary terminal pin of an electrical component, and a printed circuit on a board or foil of insulating material.

BACKGROUND OF THE INVENTION

Printed circuits arranged on conductor foils have recently been used in connection with plug-in or rack wirings. Also, in the case of smaller structural units, such as relay bars or cross-point arrays (switching grids) such types of wirings are used. In so doing, there arises the problem of providing an unobjectionable contact-making between the not always small terminal pins and the printed circuit.

It is the object of the present invention to provide an unobjectionable and automatable contact-making between the terminal pins of electrical components or groups of components, and printed circuits as the wiring base. According to the invention an electrical connecting element is positioned in a form- and/or force-locking manner on the terminal pins and the conductors of the printed circuit, and a shrink ring of plastics material is arranged directly above the flange for holding the sleeve in position.

According to another type of embodiment there is provided a shrink ring which projects over the sleeve and surrounds the terminal pin as well.

It is also advantageous if the wiring base, i.e. the printed circuit as arranged on the conductor foil, is provided with the electrical connecting elements prior to it being applied to the terminal pins. According to a further embodiment of the invention a great number of electrical connecting elements are joined to form a chain by means of land portions, with these elements capable of being processed in a combined total which can be automated by means of numerical control.

The inventive type of electrical connecting element safeguards a good contact-making, and its application can be easily automated.

The advantages of this invention, both as to its construction and mode of operation, will be readily appreciated as the same become better understood by reference to the following detailed description when considered in connection with the accompanying drawings in which like referenced numerals designate like parts throughout the figures.

DESCRIPTION OF THE PREFERRED EMBODIMENT

Figure 1B:
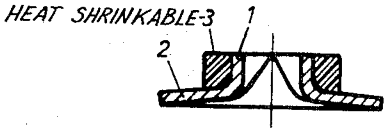
FIGS. 1*a* and 1*b* show an electrical connecting element in a top view and a sectional view, respectively.
Figure 1A:
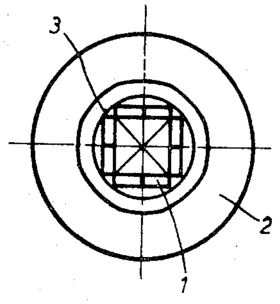

Referring now to FIGS. 1*a* and 1*b*, the electrical connecting element consists of a sleeve 1 terminating in a flange 2, and a shrink ring 3 placed on the sleeve 1. This shrink ring 3 has the property of shrinking to a maximum of 50 percent when being heated to about 100° C. The cross section of the sleeve 1 is smaller than the cross section of the terminal pin on which it is used.

The flanges 2, for manufacturing the sleeve 1, may be differently cut. FIG. 1*b* shows a sectional view, and the sleeve embodiment for use in connection with a rectangular terminal pin. With respect to round (circular) pins it would be appropriate to provide the flange with a circular hole and four indentations.

Figure 2:
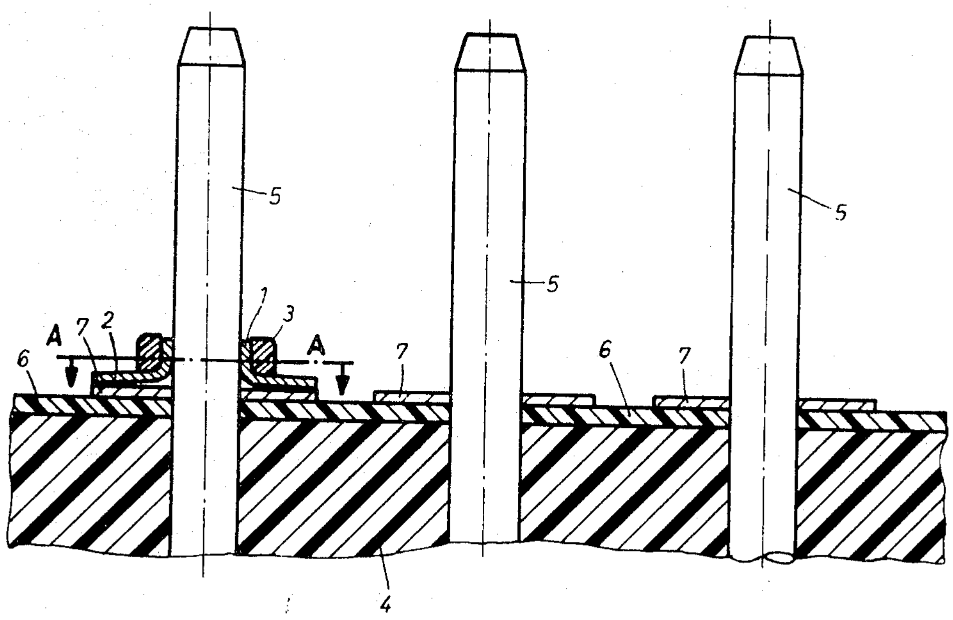
FIG. 2 shows the electrical connecting element as arranged on a terminal pin.

FIG. 2 shows part of an insulating component 4 with respect to which the wiring of the terminal pins 5 is effected by means of a printed circuit. This printed circuit consists of an insulating conductor foil 6 and of the conductors 7 arranged thereon. The electrical contact is established at the desired point by the already described connecting element. In so doing, the flange 2 is lying on the conductor 7, and the sleeve presses against the terminal pin 5. Upon heating the shrink-on ring 3, the latter is placed tightly around the sleeve 1 and the terminal pin 5, and also fills out the cavities or hollow spaces as shown in FIG. 3.

Figures 3, 4:
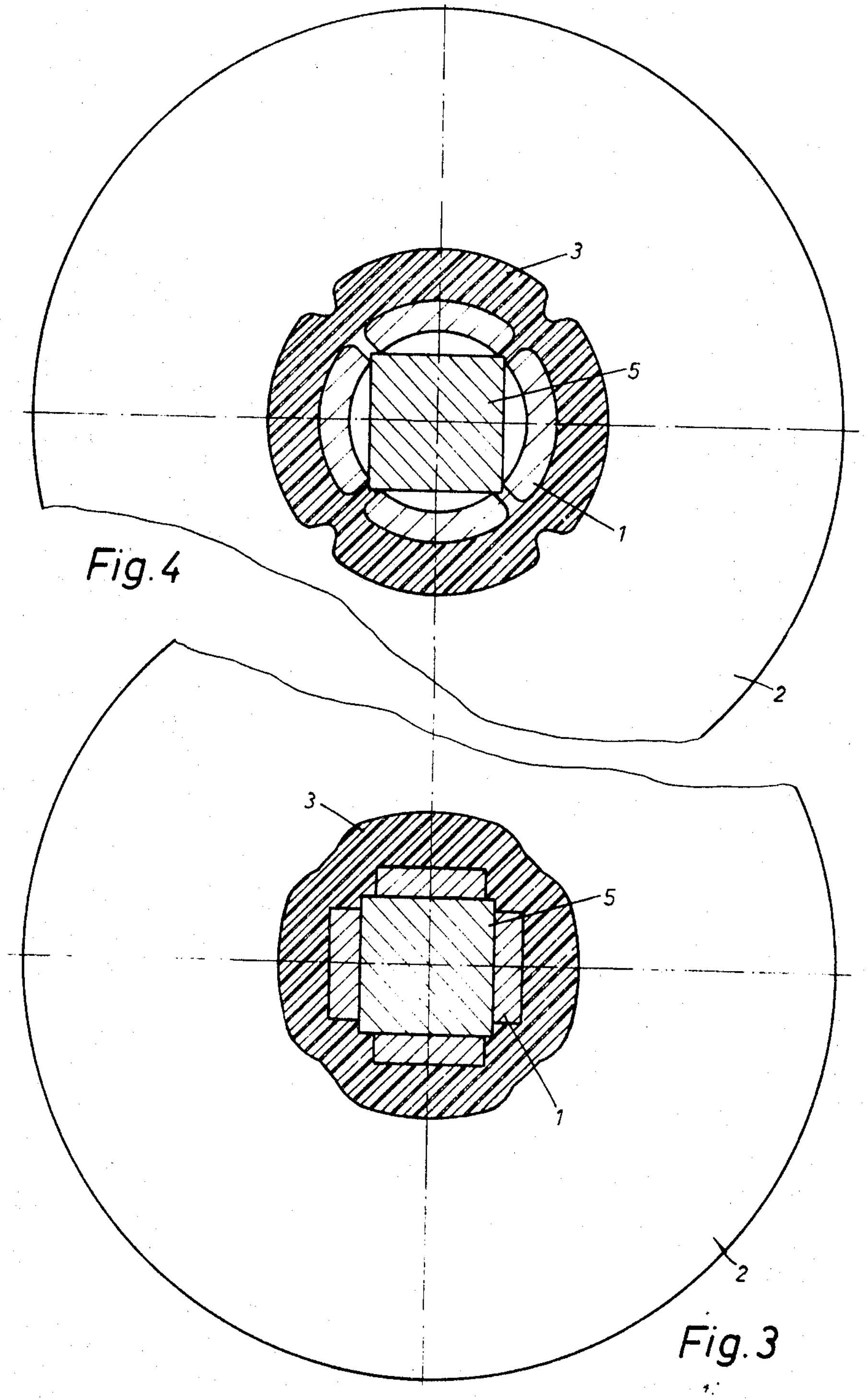
FIG. 3 shows a section taken on line A—A of FIG. 2.
FIG. 4 shows an alternative embodiment of the device of FIG. 3.

FIG. 4 sectionally shows how the shrink ring 3 is formed around circular sleeves. If, in connection with rectangular terminal pins 5 there are used electrical connecting elements comprising a circularly designed sleeve 1 consisting of four parts, then the edges of the sleeve 1 are pressed against the terminal pin 5. The shrink ring 3, subsequent to being heated, will fill out all interspaces, and will safeguard a firm seating.

The establishment of an electrical connection between the terminal pin 5 and the conductor 7 will now be described in detail. The inventive connecting element (FIG. 1) is slipped into position by hand, with the aid of an individual tool or, appropriately, by means of a multiple tool, and placed at the desired point on to the terminal pin 5, and is pressed against the conductor 7. Since the cross section of the sleeve 1 is smaller than that of the terminal pin 5 a pinch fit will result for the sleeve 1 (FIG. 2). After that the shrink ring 3 is heated, for example, by means of hot air, and due to the shrinkage process taking place, the shrink ring 3 will be pressed tightly against the terminal pin 5 and the conductor 7 (FIGS. 3 and 4). After cooling down, the electrical connection is completed.

Figure 6:
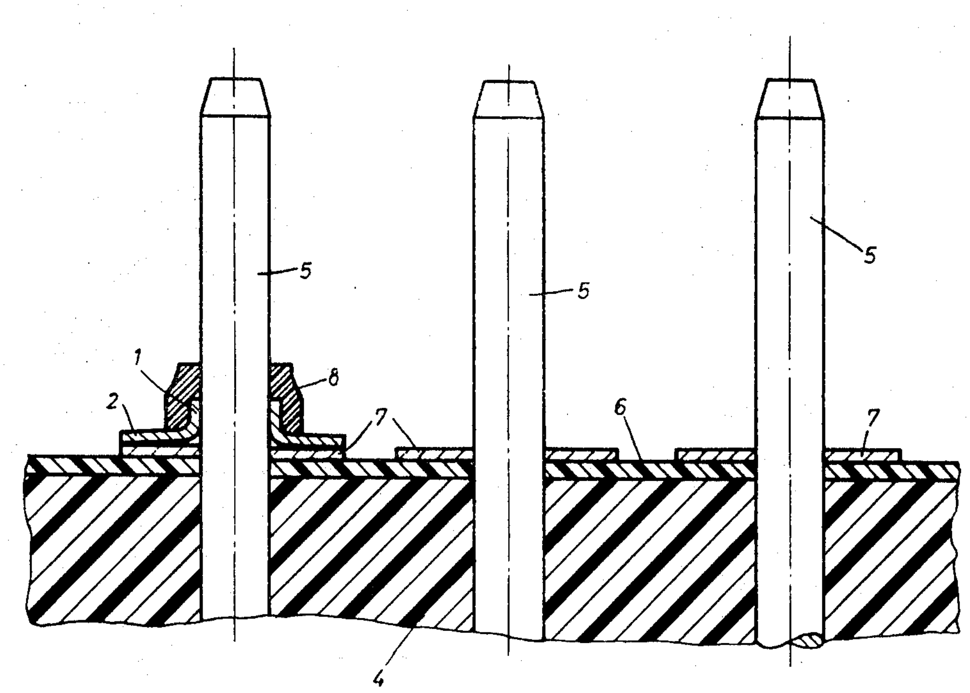
FIG. 6 shows the electrical connecting element according to FIG. 5 in the built-in condition.
Figure 5B:
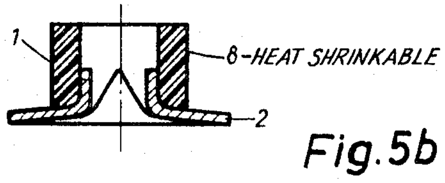
FIGS. 5*a* and 5*b* show an alternative embodiment of the electrical connecting element in a top and sectional view, respectively.
Figure 5A:
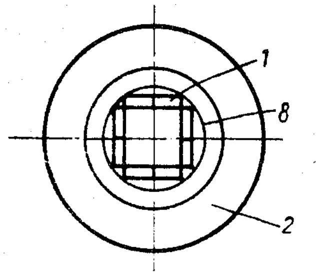

As is shown in FIGS. 5*a* and 5*b*, there may also be used a shrink ring 8 projecting over the sleeve 1. As previously described, this connecting element is placed at the desired point of contact, on to a terminal pin 5. The shrink ring 8, which is reduced in size upon being heated, will in this case not only press the sleeve 1 against the terminal pin 5 ad the flange 2 against the conductor 7, but also places itself against the terminal pin 5 of FIG. 6. In this way, the point of contact is sealed from the pin end.

Figure 7:
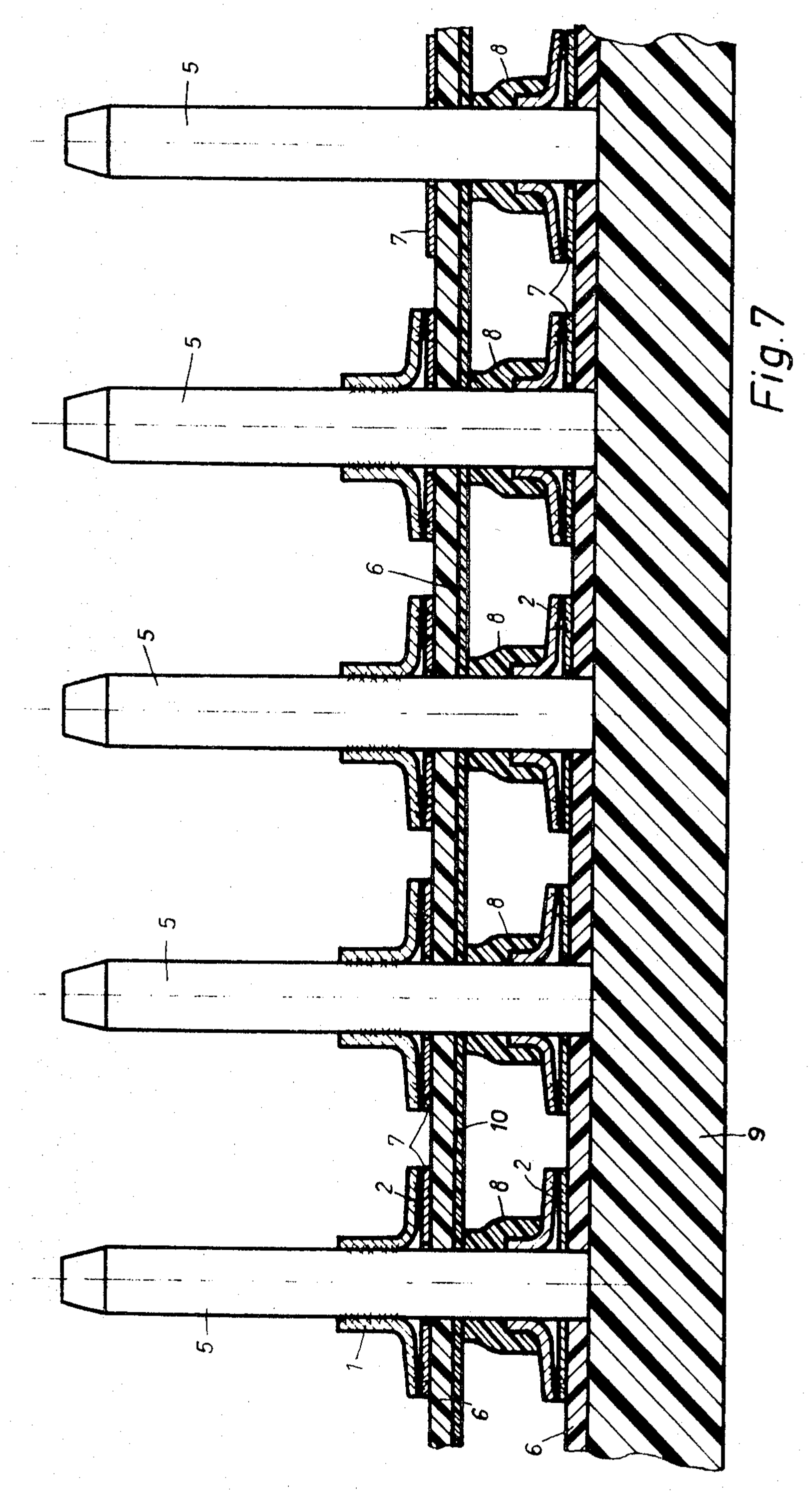
FIG. 7 shows a multilayer wiring employing the inventive types of electrical connecting elements.

The electrical connecting elements may also be used without shrink rings, and may be attached by way of spot weldings to the terminal pins of the components, and to the conductors. One such type of embodiment is shown in FIG. 7 for a multilayer wiring of a structural unit or group of components 9 comprising a great number of fixed terminal pins 5. On the insulating unit 9 there is deposited a conductor foil 6 comprising conventionally manufactured printed circuitry. To the points provided for the contact-making between the terminal pins 5 and the conductors 7, the connecting elements are applied in the manner previously described. A thin insulating intermediate plate 10 is placed thereover. Then placed is the second plane of the wiring which again consists of a conductor foil 6 with a printed circuit. The electrical connecting elements are mounted at the respective points by way of spot welding. In so doing, the flange 2 is welded to an associated conductor 7, and the corresponding sleeve 1 is welded to the terminal pin 5 surrounded thereby. When connecting elements according to FIG. 5 are used in the lower wiring plane, the intermediate plate 10 may be omitted, and the following wiring base may be applied directly.

Figure 8:
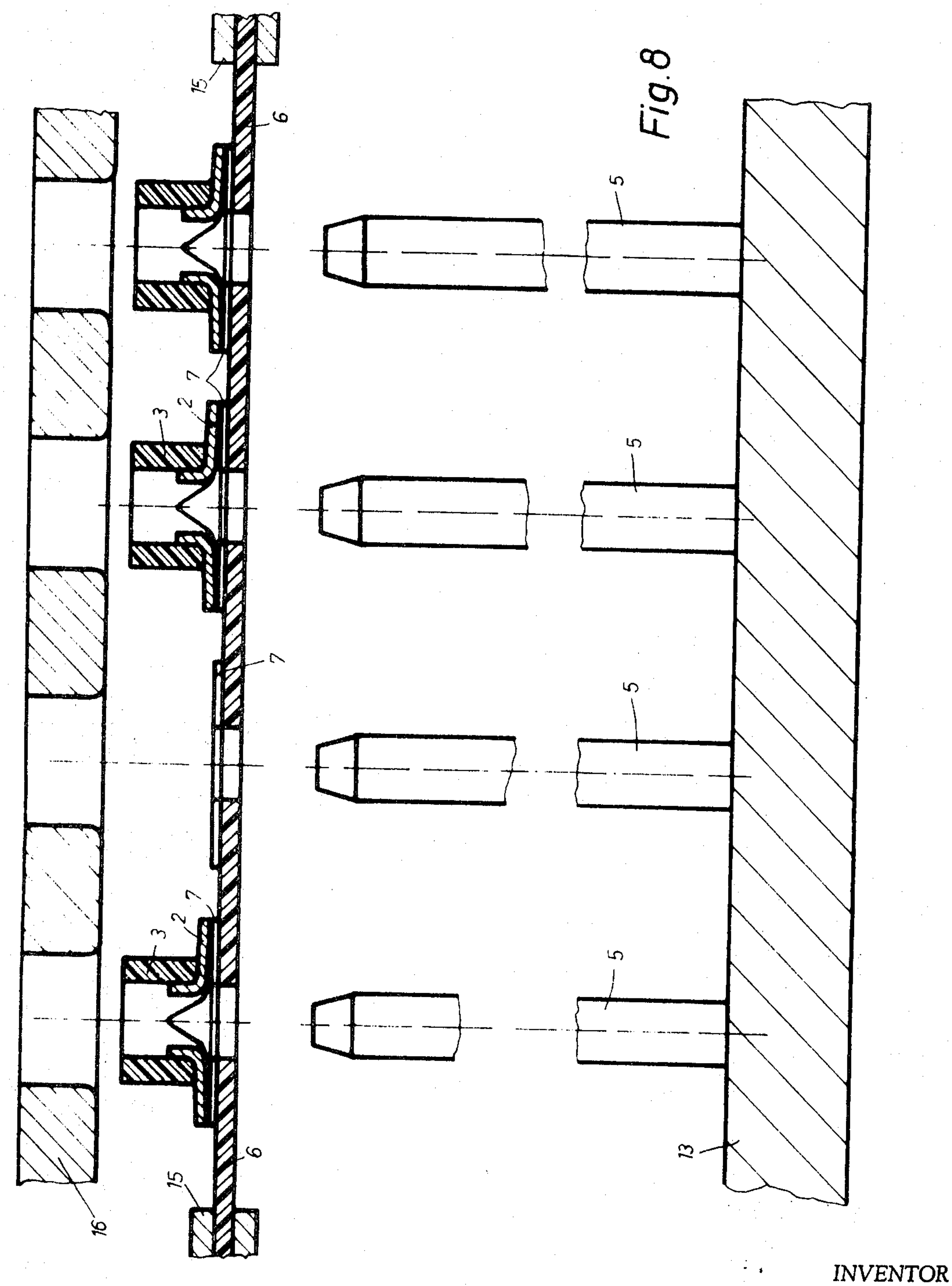
FIG. 8 shows a conductor foil with the electrical connecting elements.

If identical kinds of patterns are to be wired to stationary terminal pins (or terminals) it is possible, for the sake of further simplification, to use a conductor foil with electrical connecting elements welded thereon. In FIG. 8 the wiring base, i.e. the conductor foil 6 is inserted in a clamping and assembling frame 15, and at the desired points of later contact-making, the electrical connecting elements may be effected in an arrangement which is automatically guided by stored information in connection with a control mechanism. This conductor foil 6 together with the contact elements welded thereto, may then be placed by a press-in tool 16 on to the components 13 carrying the terminal pins 5, whereupon the tool is pressed down and the shrink rings 3 are heated.

Subsequently thereto, both the press-in tool 16 and the clamping and assembling frame 15 are removed.

Figure 9:
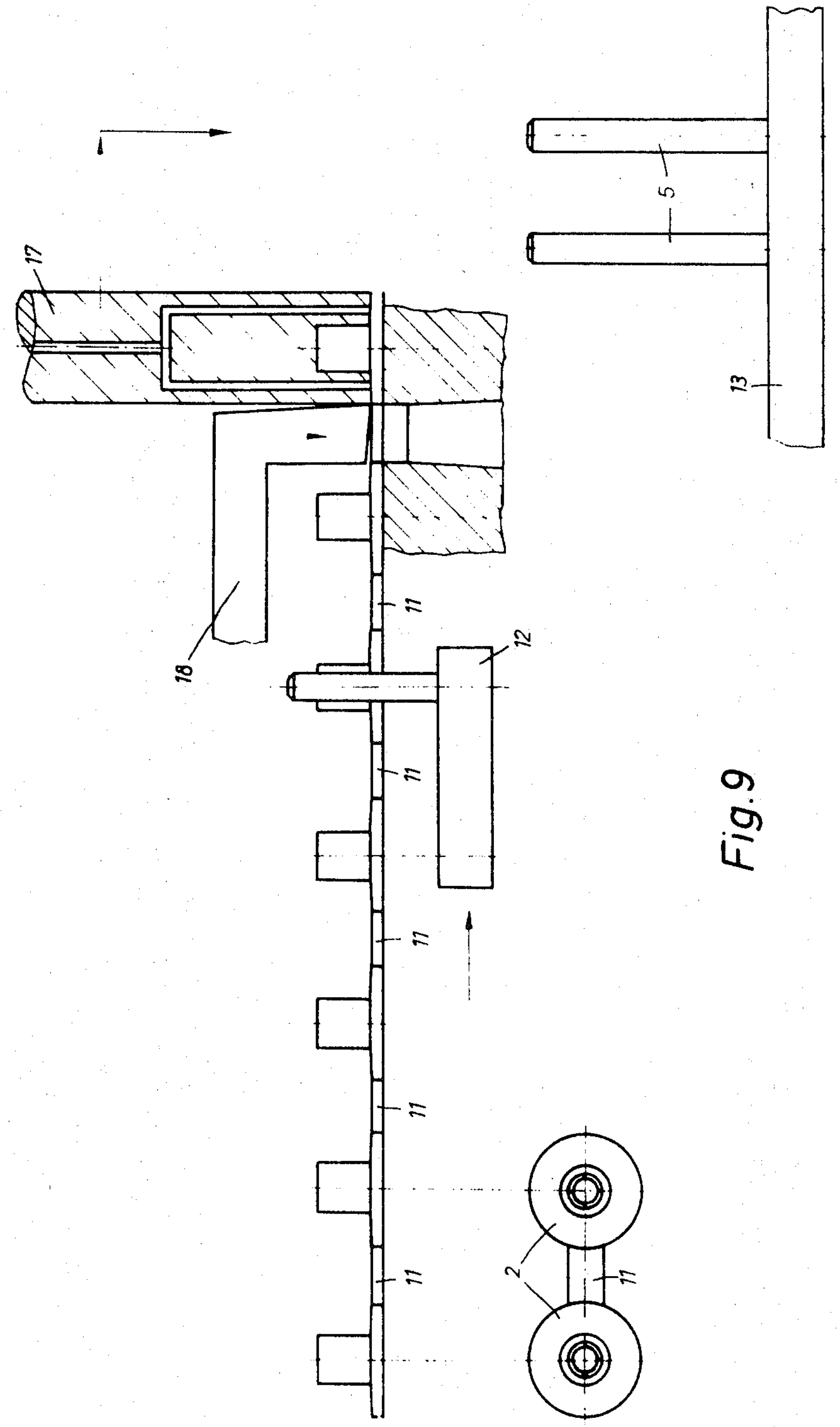
FIG. 9 shows a combined assembling tool.

In cases where individual terminal pins are to be provided with the electrical connecting elements over a large surface area, and it is not possible to use a conductor foil with contact elements welded thereto, it may be of advantage to use a combined assembling tool. One such type of tool is shown in FIG. 9. The electrical connecting elements are joined to one another between the flanges 2 by means of land portions 11, thus forming a chain. By a centering device 12 the contact-making connecting elements are inserted in the assembling tool 17, and are then separated from the chain by being cut by a separating tool 18. The assembling tool 17 is now moved in the direction as indicated by the arrows, towards the selected terminal pin 5, thus establishing the contact in the manner already described hereinbefore. The combined assembling tool may be built into a coordinate table, and controlling thereof may be subjected to tape programming.

What is claimed is:

1. In combination:

an electrical terminal pin extending from an electrical mounting structure, an electrical conductor member mounted on said mounting structure in a plane perpendicular and adjacent to said terminal pin, an electrical connecting element having a sleeve portion surrounding said terminal pin and a flange portion secured to said conductor, and a heat shrunk ring formed of a plastic material mounted on said sleeve directly above said flange securing said element to said pin.

* * * * *